(12) United States Patent
Taniguchi et al.

(10) Patent No.: US 9,334,470 B2
(45) Date of Patent: May 10, 2016

(54) CLEANING LIQUID COMPOSITION FOR ELECTRONIC DEVICE

(71) Applicant: Kanto Kagaku Kabushiki Kaisha, Tokyo (JP)

(72) Inventors: Yumiko Taniguchi, Soka (JP); Kikue Morita, Soka (JP); Chiyoko Horike, Soka (JP); Takuo Ohwada, Soka (JP)

(73) Assignee: KANTO KAGAKU KABUSHIKI KAISHA, Tokyo (JP)

( * ) Notice: Subject to any disclaimer, the term of this patent is extended or adjusted under 35 U.S.C. 154(b) by 41 days.

(21) Appl. No.: 13/705,575

(22) Filed: Dec. 5, 2012

(65) Prior Publication Data

US 2013/0143785 A1  Jun. 6, 2013

(30) Foreign Application Priority Data

Dec. 6, 2011  (JP) .................. 2011-267368

(51) Int. Cl.
| | |
|---|---|
| *C11D 7/32* | (2006.01) |
| *C11D 7/36* | (2006.01) |
| *C11D 11/00* | (2006.01) |
| *C23G 1/18* | (2006.01) |
| *C23G 1/20* | (2006.01) |
| *H01L 21/02* | (2006.01) |

(Continued)

(52) U.S. Cl.
CPC ................ *C11D 7/3209* (2013.01); *C11D 3/30* (2013.01); *C11D 3/361* (2013.01); *C11D 7/36* (2013.01); *C11D 11/0047* (2013.01); *C23G 1/18* (2013.01); *C23G 1/20* (2013.01); *H01L 21/02052* (2013.01); *H01L 21/02068* (2013.01)

(58) Field of Classification Search
CPC .................................................. C11D 11/0047
USPC .................................. 510/175, 176; 134/1.3
See application file for complete search history.

(56) References Cited

U.S. PATENT DOCUMENTS

| | | | | |
|---|---|---|---|---|
| 5,509,969 | A | * | 4/1996 | Grawe ............................ 134/2 |
| 6,080,709 | A | | 6/2000 | Ishikawa et al. |
| 6,143,705 | A | | 11/2000 | Kakizawa et al. |

(Continued)

FOREIGN PATENT DOCUMENTS

| | | |
|---|---|---|
| EP | 1 310 989 | 5/2003 |
| EP | 1 562 225 | 8/2005 |

(Continued)

OTHER PUBLICATIONS

Extended European Search Report mailed Mar. 11, 2013 for Application No. EP 12 19 5375.

(Continued)

*Primary Examiner* — Gregory Webb
(74) *Attorney, Agent, or Firm* — Hauptman Ham, LLP

(57) ABSTRACT

[Purpose]
To provide a cleaning liquid composition that has excellent removability for metallic impurities and particulates, does not cause corrosion of Cu, and can clean a semiconductor substrate having copper wiring in a production process for an electronic device such as a semiconductor device.
[Solution means]
A cleaning liquid composition for cleaning a semiconductor substrate having copper wiring, the cleaning liquid composition containing one or more types of basic compound containing no metal, and one or more types of phosphonic acid-based chelating agent, and having a hydrogen ion concentration (pH) of 8 to 10.

16 Claims, 3 Drawing Sheets

(51) Int. Cl.
*C11D 3/30* (2006.01)
*C11D 3/36* (2006.01)

(56) References Cited

U.S. PATENT DOCUMENTS

| | | | |
|---|---|---|---|
| 6,730,644 B1 | 5/2004 | Ishikawa et al. | |
| 2002/0077259 A1* | 6/2002 | Skee | 510/175 |
| 2003/0083214 A1 | 5/2003 | Kakizawa et al. | |
| 2003/0130147 A1* | 7/2003 | Koito et al. | 510/175 |
| 2003/0144163 A1* | 7/2003 | Morinaga et al. | 510/175 |
| 2004/0161933 A1 | 8/2004 | Takashima et al. | |
| 2004/0220065 A1* | 11/2004 | Hsu | 510/175 |
| 2005/0003977 A1* | 1/2005 | Itano et al. | 510/175 |
| 2005/0014667 A1* | 1/2005 | Aoyama et al. | 510/175 |
| 2006/0154838 A1 | 7/2006 | Hayashida et al. | |
| 2009/0149025 A1* | 6/2009 | Miyamoto et al. | 438/694 |
| 2011/0098205 A1 | 4/2011 | Lee | |
| 2011/0136717 A1 | 6/2011 | Tamboli et al. | |
| 2011/0247650 A1 | 10/2011 | Lee | |
| 2012/0302482 A1* | 11/2012 | Tamura et al. | 510/165 |

FOREIGN PATENT DOCUMENTS

| | | |
|---|---|---|
| JP | 6-41773 | 2/1994 |
| JP | 11-131093 | 5/1995 |
| JP | 09286999 A | 11/1997 |
| JP | 10-072594 | 3/1998 |
| JP | 11-116984 | 4/1999 |
| JP | 200025250 A | 9/2000 |
| JP | 2001-7071 | 1/2001 |
| JP | 2002069495 A | 3/2002 |
| JP | 2003-510840 | 3/2003 |
| JP | 2005060660 A | 3/2005 |
| JP | 2008-543060 | 11/2008 |
| JP | 2009-81445 | 4/2009 |
| JP | 2009-84568 | 4/2009 |
| JP | 2009-87523 | 4/2009 |
| JP | 2009194049 A | 8/2009 |
| JP | 2010138271 A | 6/2010 |
| JP | 2010-163608 | 7/2010 |
| JP | 2011-040722 | 2/2011 |
| WO | 01/24242 | 4/2001 |
| WO | 03/006598 | 1/2003 |
| WO | 03/104900 | 12/2003 |
| WO | 2004/042811 | 5/2004 |
| WO | 2006/127885 | 11/2006 |

OTHER PUBLICATIONS

Japanese Office Action dated Dec. 1, 2015 in connection with the counterpart Japanese Patent Application No. 2011-267368.

* cited by examiner

Oxide is not formed in acidic region.

In alkaline region it is possible to form an oxide film layer on the surface by control of potential.

CLEANING LIQUID COMPOSITION FOR ELECTRONIC DEVICE

CROSS REFERENCE TO RELATED APPLICATION

This application claims the priority of Japanese Patent Application No. 2011-267368, filed on Dec. 6, 2011 in the JPO (Japan Patent Office), the disclosure of which is incorporated herein in their entirety by reference.

TECHNICAL FIELD

The present invention relates to a cleaning liquid composition used in the cleaning of an electronic device. More particularly, it relates to a cleaning liquid used for cleaning a metal material surface, in particular a semiconductor substrate having copper wiring, that has been subjected to a polishing treatment, an etching treatment, a chemical mechanical polishing (hereinafter, also called 'CMP') treatment, etc. in a production process of an electronic device such as a semiconductor device, and a method for cleaning said electronic device by employing same.

BACKGROUND ART

Accompanying the increasing integration of ICs, since a trace amount of an impurity affects the performance and yield of a device, strict contamination control is required. That is, there is a demand for strict control of contamination of a substrate, and various types of cleaning liquids are used in various steps of semiconductor fabrication.

In general, as a substrate cleaning liquid for a semiconductor, in order to remove particulate contamination ammonia-aqueous hydrogen peroxide-water (SC-1), which is an alkaline cleaning liquid, is used, and in order to remove metal contamination sulfuric acid-aqueous hydrogen peroxide, hydrochloric acid-aqueous hydrogen peroxide-water (SC-2), dilute hydrofluoric acid, etc., which are acidic cleaning liquids, are used; the cleaning liquids are used singly or in combination according to the intended application.

On the other hand, accompanying progress in the increase in fineness and the multilayer wiring structure of devices, in each step more elaborate planarization of a substrate surface is required; as new techniques, CMP techniques have been introduced into the semiconductor production process, in which polishing and planarization of an insulating film or a metal material is carried out by pressing a wafer against a polishing cloth called a buff while supplying a slurry mixture of polishing particles and a chemical agent, and rotating so as to effect a chemical action and a physical action in combination. At the same time, the substrate surface to be planarized and materials forming the slurry have been changing. The substrate surface after CMP is contaminated by particles represented by alumina, silica, or cerium oxide particles contained in the slurry, the constituent substance of the surface to be polished, or metallic impurities originating from the agent contained in the slurry.

It is necessary to completely remove these contaminants before entering a subsequent step since they cause pattern defects, adhesion failure, improper electrical properties, etc. As normal post-CMP cleaning in order to remove these contaminants, brush cleaning is carried out, in which a chemical action due to a cleaning liquid and a physical action due to a polyvinyl alcohol sponge brush, etc. are used in combination. As the cleaning liquid, conventionally, an alkali such as ammonia has been used for the removal of particles. Furthermore, a technique employing an organic acid and a complexing agent for the removal of metal contamination has been proposed in Patent Document 1 and Patent Document 2.

Moreover, as a technique for removing metal contamination and particulate contamination at the same time, a cleaning liquid employing an organic acid and a surfactant in combination has been proposed in Patent Document 3. However, accompanying progress in the increase in fineness of wiring patterns of semiconductor devices, corrosion of Cu during post-CMP cleaning has to be taken into consideration, and an acidic cleaning liquid has the problem of an increase in the roughness of the surface. On the other hand, a basic cleaning liquid damages a low permittivity (low-k) interlayer insulating film material, which has been introduced accompanying the increase in fineness of wiring.

Patent Document 4 discloses a cleaning agent composition containing a phosphonic acid compound, an ethylene oxide compound and/or a propylene oxide compound, etc. and having suppressed foaming performance, Patent Document 5 discloses a solution for cleaning a post-CMP semiconductor surface containing a carboxylic acid, an amine-containing compound, and phosphonic acid, Patent Document 6 discloses a semiconductor wafer treatment liquid containing an alkali component and an adsorption prevention agent, and Patent Documents 7 to 9 disclose various types of cleaning compositions containing a surfactant or a chelating agent used for cleaning a semiconductor substrate, a magnetic disk, etc., but in none thereof has an investigation been carried out into a substrate having copper wiring.

As a composition for cleaning a substrate having Cu wiring, Patent Document 10 discloses a formulation containing a sulfonic acid-based polymer, Patent Document 11 discloses a cleaning composition containing a porous dielectric, a corrosion inhibiting solvent compound, an organic co-solvent, a metal chelating agent, and water, and Patent Document 12 discloses a cleaning liquid containing a chelating agent or a salt thereof, an alkali metal hydroxide, and water; in none of the compositions has an investigation into damage to a low-k material or an investigation into the removal of both particulates and metallic impurities been carried out. Patent Document 13 discloses a cleaning liquid containing an deactivator that deactivates the surface of a low-k material, but it requires a step of removing a deactivated film formed by said deactivator.

As described above, up to now there is no known cleaning liquid that has excellent removability for metallic impurities and particles and that is free from problems with copper corrosion and damage to a low permittivity interlayer insulating film.

RELATED ART DOCUMENTS

Patent Documents

[Patent Document 1] JP, A, 10-072594
[Patent Document 2] JP, A, 11-131093
[Patent Document 3] JP, A, 2001-7071
[Patent Document 4] JP, A, 11-116984
[Patent Document 5] JP, A (PCT) 2003-510840
[Patent Document 6] JP, A, 06-041773
[Patent Document 7] JP, A, 2009-084568
[Patent Document 8] JP, A, 2009-087523
[Patent Document 9] JP, A, 2010-163608
[Patent Document 10] JP, A, 2011-040722
[Patent Document 11] JP, A, 2009-081445
[Patent Document 12] International Patent Application WO 2004/042811
[Patent Document 13] JP, A (PCT) 2008-543060

SUMMARY OF THE INVENTION

Problems to be Solved by the Invention

It is therefore an object of the present invention to provide a cleaning liquid composition that has excellent removability for metallic impurities and particulates and can carry out cleaning without causing corrosion of a metal material such as Cu in cleaning of a metal material surface, in particular a substrate having copper wiring, that has been subjected to a polishing treatment, an etching treatment, a chemical mechanical polishing (CMP) treatment, etc. in a production process of an electronic device such as a semiconductor device.

Means for Solving the Problems

While carrying out an intensive investigation in order to solve the above-mentioned problems the present inventors have found that a cleaning liquid composition containing one or more basic compound containing no metal and one or more phosphonic acid-based chelating agent and having a hydrogen ion concentration (pH) of 8 to 10 can achieve high removability for both metallic impurities and particulates, does not cause corrosion of a metal material such as Cu, and can suppress further oxidation by protecting the cleaned Cu surface by means of a thin oxide film, and as a result of further research, the present invention has been accomplished.

That is, the present invention relates to the following.
(1) A cleaning liquid composition for cleaning a semiconductor substrate having copper wiring, the cleaning liquid composition containing one or more basic compound containing no metal, and one or more phosphonic acid-based chelating agent, and having a hydrogen ion concentration (pH) of 8 to 10.
(2) The cleaning liquid composition according to (1) above, wherein the semiconductor substrate having copper wiring is a substrate after chemical mechanical polishing (CMP).
(3) The cleaning liquid composition according to (1) or (2) above, wherein the basic compound containing no metal is a quaternary ammonium compound or a straight-chain aliphatic amine.
(4) The cleaning liquid composition according to any one of (1) to (3) above, wherein it does not contain aqueous hydrogen peroxide.
(5) The cleaning liquid composition according to any one of (1) to (4) above, wherein it does not contain ascorbic acid.
(6) The cleaning liquid composition according to any one of (1) to (5) above, wherein it does not contain a carboxylic acid-based chelating agent.
(7) The cleaning liquid composition according to any one of (1) to (6) above, wherein the basic compound containing no metal is a quaternary ammonium compound other than tetramethylammonium hydroxide, or an alkanolamine.
(8) The cleaning liquid composition according to any one of (1) to (7) above, wherein the phosphonic acid-based chelating agent is N,N,N',N'-ethylenediaminetetrakis(methylenephosphonic acid) (EDTPO), glycine-N,N-bis(methylenephosphonic acid) (glyphosine), nitrilotris(methylenephosphonic acid) (NTMP), or a salt thereof.
(9) The cleaning liquid composition according to any one of (1) to (8) above, wherein it further contains one or more anionic or nonionic surfactant.
(10) A concentrate for dilution by 10 times to 1000 times to give the cleaning liquid composition according to any one of (1) to (9) above.
(11) The concentrate according to (10) above, wherein it is diluted with a diluent containing water.
(12) The concentrate according to (10) or (11) above, wherein it has a pH of 10 to 12.
(13) A method for cleaning a semiconductor substrate having copper wiring by use of the cleaning liquid composition according to any one of (1) to (9) above.

Effects of the Invention

The cleaning liquid composition of the present invention has excellent removability for metallic impurities and particulates, does not cause corrosion of a metal material such as Cu, and can suppress further oxidation by protecting the cleaned Cu surface by means of a thin oxide film in cleaning of a metal material surface that has been subjected to a polishing treatment, an etching treatment, a chemical mechanical polishing (CMP) treatment, etc. in a production process of an electronic device such as a semiconductor device.

MODES FOR CARRYING OUT THE INVENTION

Figure 1:
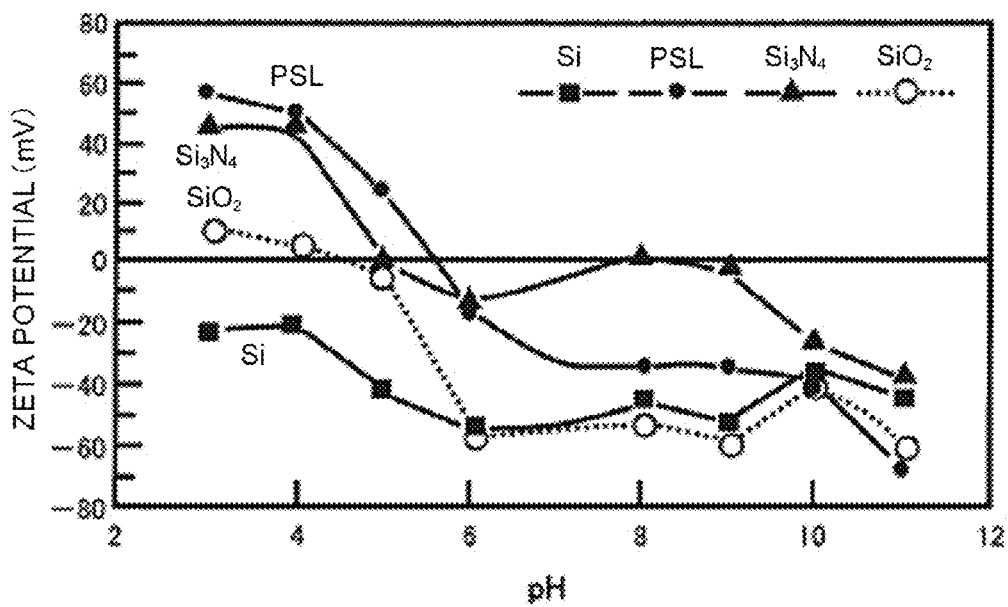
FIG. 1 is a diagram showing the pH dependence of the zeta potential of a PSL (polystyrene latex) particle surface, an $SiO_2$ surface, an $SiN_4$ surface, and a Bare Si surface (THE CHEMICAL TIMES 2005, No. 4, p6).

In one embodiment, the present invention provides a cleaning liquid composition for cleaning a semiconductor substrate having copper wiring, the cleaning liquid composition containing one or more basic compound containing no metal, and one or more phosphonic acid-based chelating agent, and having a hydrogen ion concentration (pH) of 8 to 10.

The cleaning liquid composition of the present invention is suitable for a semiconductor substrate having copper wiring and is particularly suitable for a substrate after chemical mechanical polishing (CMP). On a post-CMP substrate surface, in addition to various types of wiring, barrier metal materials (Cu, Ti-based compound, Ta-based compound, Ru, etc.), and insulating film material ($SiO_2$, low-k material) on the substrate surface, there might be particulates or metallic impurities contained in a slurry. The particulates are mainly of alumina, silica, and cerium oxide, and examples of the metallic impurities include Cu that is dissolved in the slurry during polishing and becomes reattached, Fe originating from an oxidizing agent in the slurry, and a Cu organometallic complex formed by a reaction between Cu and a Cu corrosion inhibitor contained in the slurry.

In the present invention, the low-k material is a material that is used for an interlayer insulating film, etc. and has low permittivity; examples thereof include, but are not limited to, a SiOC-based material, porous silicon, a silicon-containing organic polymer, an aromatic aryl ether compound, and a fluorocarbon, and porous silicon and a silicon-containing organic polymer are mainly used at the present. Specific examples include Black Diamond (Applied Materials, Inc.), Aurora (ASM International), and CERAMATE NCS (JGC Catalysts and Chemicals Ltd.).

The basic compound used in the present invention is not particularly limited as long as it is a compound that can adjust the pH to a predetermined level, but a basic compound containing no metal is preferable when it is used for an electronic device. If a metal is contained in the composition, back-contamination and diffusion into the interior of the substrate occur, and this might cause degradation of semiconductor properties or an increase in leakage current due to improper insulation of an interlayer insulating film.

Examples of the basic compound include, but are not limited to, a quaternary ammonium compound and an amine. Examples of the quaternary ammonium compound include tetramethylammonium hydroxide (TMAH), trimethyl-2-hydroxyethylammonium hydroxide(choline), tetraethylammonium hydroxide, tetrapropylammonium hydroxide, tetrabutylammonium hydroxide, trimethylphenylammonium hydroxide, and benzyltrimethylammonium hydroxide. Among them, choline and tetraethylammonium hydroxide are preferable.

Examples of the amine include, but are not limited to, an organic amine such as a primary, secondary, or tertiary aliphatic amine, an alicyclic amine, an aromatic amine, and a heterocyclic amine. Examples of the primary aliphatic amine include, but are not limited to, monoethanolamine, ethylenediamine, 2-(2-aminoethoxyethanol), and 2-(2-aminoethylamino)ethanol.

Examples of the secondary aliphatic amine include, but are not limited to, diethanolamine, N-methylaminoethanol, dipropylamine, and 2-ethylaminoethanol. Examples of the tertiary aliphatic amine include, but are not limited to, triethanolamine, dimethylaminoethanol, and ethyl diethanolamine.

Examples of the alicyclic amine include, but are not limited to, cyclopentylamine and cyclohexylamine.

Examples of the aromatic amine include, but are not limited to, aniline.

Examples of the heterocyclic amine include, but are not limited to, piperidine, N-methylpiperidine, N-aminoethylpiperidine, piperazine, N-methylpiperazine, N,N'-dimethylpiperazine, N-hydroxyethylpiperazine, N-methyl-N'-hydroxyethylpiperazine, N-aminoethylpiperazine, N,N'-dimethylaminoethylmethylpiperazine, morpholine, N-methylmorpholine, N-hydroxyethylmorpholine, and N-aminoethylmorpholine.

The basic compound might, depending on its molecular structure, cause damage to a low-k material. In particular, when a primary amine is used, a low-k material is often damaged, and because of this the basic compound is preferably a secondary amine, a tertiary amine, or a quaternary ammonium compound. Furthermore, among the amines, since some alicyclic amine, cyclic amine, and heterocyclic amine compounds, which have a cyclic structure within the structure, might strongly adsorb on the Cu surface and become foreign matter, a straight-chain aliphatic amine such as an alkanolamine is more preferable. Moreover, since some primary amine and secondary amine compounds have a high complex stability constant with Cu and form a water-soluble complex, Cu tends to be dissolved. Therefore, as the amine, diethanolamine, which is a secondary aliphatic amine, and triethanolamine, which is a tertiary aliphatic amine, are preferable, and triethanolamine is particularly preferable.

Furthermore, the content of the basic compound is not particularly limited since it is for adjusting the pH, which varies depending on the type of basic compound and the type and content of other components, but the content at the time of use is preferably 0.5 to 50 mmol/L, and more preferably 0.5 to 30 mmol/L. When the content of the basic compound is too low, the pH might change due to slight variation in the composition or contamination with impurities, and when the content of the basic compound is too high, there is a possibility that damage to a low-k material will increase.

In one embodiment, the present invention does not contain tetramethylammonium hydroxide (TMAH). Among quaternary ammonium compounds, tetramethylammonium hydroxide has high toxicity, and since it has recently tended to be avoided by manufacturers who take into consideration the effect on a worker during a production process, it is preferable for it not to be contained as far as possible.

In the present invention, the pH of the cleaning liquid composition is preferably 8 to 10. One of the main features of the cleaning liquid of the present invention is the ability to remove particulates without using a surfactant. This is because charging of the substrate and the particulates is controlled so that both are negative by utilizing a change in charging of the surface of an oxide such as $SiO_2$ or $TiO_2$ in a basic region (see FIG. 1), and the substrate and the particulates can be separated by means of an electrostatic repulsive action. However, a conventional basic cleaning liquid cannot sufficiently remove metallic impurities on the substrate surface. It is surmised that in a basic region metallic impurities react with hydroxide ion ($OH^-$), adsorb on the substrate surface as a hydroxide or a hydroxy complex, and do not dissolve in a liquid.

Although the removability of metallic impurities is improved by decreasing the pH, the removability of particulates deteriorates, and damage to Cu applied to the substrate surface tends to increase. On the other hand, when the pH is increased, although the removability of particulates improves, the removability of metallic impurities deteriorates, and damage to a SiOC-based low-k material, which is brittle in a basic region, tends to increase. In accordance with the present invention, adjusting the pH to 8 to 10 enables both particulates and metallic impurities to be removed and cleaning to be carried out without damaging either Cu or a low-k material.

Figure 2:
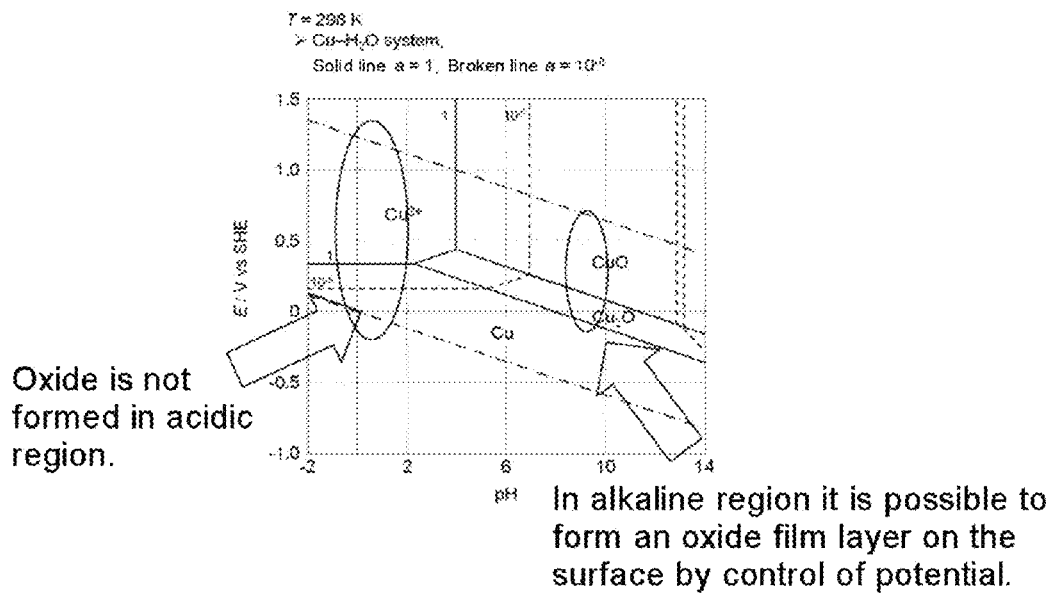
FIG. 2 is a diagram showing a Pourbaix diagram of a Cu-water system.

Furthermore, in this pH region, in cleaning after Cu-CMP, a thin $Cu_2O$ layer can be formed on the cleaned Cu surface, and rapid surface oxidation when left in the atmosphere can be suppressed. Cu is in a $Cu^{2+}$ or $Cu^0$ state in an aqueous system when the pH is in an acidic region, it is in a highly active state, and it is easy for it to be rapidly oxidized, but in an alkaline region it is in a CuO or $Cu_2O$ state (see FIG. 2). Therefore, at a pH in an acidic region, on a post-CMP Cu surface, a non-uniform oxidation reaction proceeds, a non-uniform oxide film covers the surface, and the roughness of the surface increases. In contrast thereto, when the pH is 8 to 10, since a thin $Cu_2O$ layer can be formed, this layer functions as a protecting film and suppresses rapid oxidation, and cleaning giving excellent flatness becomes possible.

The cleaning liquid composition of the present invention contains a phosphonic acid-based chelating agent. In order to impart metallic impurity removability, adding a chelating agent is effective, but since the effect differs according to the pH of the solution or the type of metal that is to be removed, it is difficult to select a chelating agent that is appropriate. A carboxylic acid-based chelating agent such as NTA, EDTA, or DPTA, an aliphatic carboxylic acid such as oxalic acid or lactic acid or a salt thereof, an aromatic carboxylic acid such as benzoic acid or a salt thereof, a hydroxycarboxylic acid or a salt thereof, a sulfonic acid-based chelating agent, an amino acid, etc., which are usually used, cannot exhibit a sufficient complex forming ability in this pH region, and the metallic impurity removability is low. On the other hand, the phosphonic acid-based chelating agent has excellent removability for metallic impurities in a pH region of 8 to 10 and functions effectively both on Fe and Zn in particular.

The phosphonic acid-based chelating agent is not particularly limited; examples include methyldiphosphonic acid, aminotri(methylenephosphonic acid), 1-hydroxyethylidene-1,1-diphosphonic acid, nitrilotrismethylenephosphonic acid (NTMP), ethylenediaminetetrakis(methylenephosphonic acid) (EDTPO), hexamethylenediaminetetra(methylenephosphonic acid), propylenediaminetetra(methylenephosphonic acid), diethylenetriaminepenta(methylenephosphonic acid), triethylenetetraminehexa(methylenephosphonic acid), triaminotriethylaminehexa(methylenephosphonic acid), trans-1,2-cyclohexanediaminetetra(methylenephosphonic acid), glycol ether diaminetetra(methylenephosphonic acid), tetraethylenepentaminehepta(methylenephosphonic acid), and glycine-N,N-bis(methylenephosphonic acid) (glyphosine). Among them, EDTPO, glyphosine, and NTMP are preferable. With regard to the phosphonic acid-based chelating agents, they may be used either on their own or in combination with each other.

The content of the phosphonic acid-based chelating agent is not particularly limited, but the content when used is preferably 0.1 to 10 mmol/L, and more preferably 0.5 to 5 mmol/L. When the content of the phosphonic acid-based chelating agent is too low, the ability to remove metallic impurities is insufficient, and when the content of the phosphonic acid-based chelating agent is too high, there is a possibility that damage to a metal material applied to the substrate surface will increase and the surface will become rough.

The cleaning liquid composition of the present invention does not require hydrogen peroxide. When hydrogen peroxide is present at the same time, not only does corrosion of a metal material such as Cu occur, but also the stability of the composition becomes questionable due to decomposition of hydrogen peroxide. Furthermore, the cleaning liquid composition of the present invention does not require ascorbic acid, which functions as a reducing agent. This is because, since for the cleaning liquid composition of the present invention the components, the content, and the pH range are appropriately selected, corrosion of Cu when cleaning can be suppressed, and a thin oxide film can be formed on the treated Cu surface. Because of this, it is unnecessary to enhance the reducing performance of the cleaning liquid. Therefore, it is possible to solve the problem of degradation of metallic impurity removability caused by the co-presence of ascorbic acid or instability of the composition due to decomposition of ascorbic acid.

In one embodiment, the cleaning liquid composition of the present invention preferably does not contain a thiol, an azine, or an N- and/or S-containing heterocyclic compound, such as for example triazole, thiazole, tetrazole, or imidazole, which have high reactivity toward a Cu surface. Such compounds strongly adsorb on the Cu surface, if left they cause degradation of electrical properties, it is necessary to add a further step of removing them, benzotriazole in particular has low biodegradability, and the burden on a liquid waste treatment employing decomposition by means of a microorganism is high, which is not desirable.

The cleaning liquid composition of the present invention may have added thereto a surfactant in order to improve the removability of particulates. The type of surfactant may be selected appropriately according to the particulates to be removed and the substrate, but a water-soluble anionic or nonionic surfactant is preferable. Among them, a nonionic surfactant might intensify the attack on a low-k material depending on the number or ratio of ethylene oxides or propylene oxides in the structure, and it is necessary to take care in its selection.

Since the majority of the cleaning liquid composition of the present invention is formed from water, when a dilution mixer is installed in a production line for an electronic device, it may be supplied as a concentrate product and used by diluting it immediately before use by means of a diluent containing water (this including a diluent containing only ultrapure water), thereby contributing to a reduction in transport cost or carbon dioxide gas when transported, and a reduction in the production cost for an electronic device manufacturer.

The concentration ratio of the concentrate of the present invention is determined appropriately according to the composition formed, but it is generally at least 10 times, preferably 10 to 1000 times, and more preferably 50 to 200 times.

In one embodiment, the cleaning method of the present invention is a method for cleaning a semiconductor substrate having copper wiring by use of the above cleaning liquid composition, which contains one or more basic compound containing no metal and one or more phosphonic acid-based chelating agent and has a hydrogen ion concentration (pH) of 8 to 10.

EXAMPLES

With regard to the cleaning liquid composition of the present invention, the present invention is now explained in further detail by reference to Examples and Comparative Examples, but the present invention is not limited to these Examples.

<Evaluation 1: Metallic Impurity Removability>

A silicon wafer was cleaned using an aqueous ammonia (29 wt %)-aqueous hydrogen peroxide (30 wt %)-water mixed liquid (volume ratio 1:1:6) and then contaminated with calcium (Ca), iron (Fe), nickel (Ni), copper (Cu), and zinc (Zn) at a surface concentration of $10^{12}$ atoms/cm$^2$ by a spin coating method. The contaminated wafer was immersed in each cleaning liquid at 25° C. for 3 minutes without stirring, the wafer was then taken out, rinsed under running ultrapure water for 3 minutes, dried, and subjected to measurement of metal concentrations of the wafer surface using a total reflection X-ray fluorescence spectrometer, and the metallic impurity removability was thus evaluated. Table 1 shows the compositions of the cleaning liquids and the results.

TABLE 1

Results of evaluation of metallic impurity removability by cleaning liquids

| | Basic compound | | Added component | | | Metal surface concentration ($10^{10}$ atoms/cm$^2$) | | | | |
|---|---|---|---|---|---|---|---|---|---|---|
| | Type | Concn. (mmol/L) | Type | Concn. (mmol/L) | pH | Ca | Fe | Ni | Cu | Zn |
| | Before cleaning | | | | | 350.0 | 240.0 | 260.0 | 200.0 | 280.0 |
| Ex. 1 | Choline | 3.0 | EDTPO | 0.5 | 9.2 | 1.1 | 1.7 | 0.1 | D.L. | D.L. |
| Ex. 2 | Choline | 5.4 | EDTPO | 1.0 | 8.4 | 11.4 | 1.6 | D.L. | 0.9 | D.L. |
| Ex. 3 | Choline | 6.0 | EDTPO | 1.0 | 9.3 | 3.0 | 1.5 | D.L. | 0.4 | D.L. |
| Ex. 4 | Choline | 6.6 | EDTPO | 1.0 | 10.0 | 3.2 | 1.2 | D.L. | D.L. | D.L. |
| Ex. 5 | Choline | 2.2 | Glyphosine | 0.5 | 9.0 | D.L. | 1.1 | D.L. | 0.1 | 0.2 |
| Ex. 6 | Choline | 4.2 | Glyphosine | 1.0 | 8.2 | 0.8 | 4.2 | D.L. | 0.3 | D.L. |

TABLE 1-continued

Results of evaluation of metallic impurity removability by cleaning liquids

| | Basic compound | | Added component | | | Metal surface concentration ($10^{10}$ atoms/cm$^2$) | | | | |
|---|---|---|---|---|---|---|---|---|---|---|
| | Type | Concn. (mmol/L) | Type | Concn. (mmol/L) | pH | Ca | Fe | Ni | Cu | Zn |
| Ex. 7 | Choline | 4.3 | Glyphosine | 1.0 | 9.0 | D.L. | 2.6 | D.L. | 0.8 | D.L. |
| Ex. 8 | Choline | 4.6 | Glyphosine | 1.0 | 9.9 | 1.0 | 3.2 | D.L. | 0.2 | D.L. |
| Ex. 9 | Choline | 2.8 | NTMP | 0.5 | 9.1 | 0.2 | 1.2 | 0.1 | D.L. | D.L. |
| Ex. 10 | Choline | 5.2 | NTMP | 1.0 | 8.2 | 0.7 | 1.4 | D.L. | D.L. | D.L. |
| Ex. 11 | Choline | 5.6 | NTMP | 1.0 | 9.1 | 0.9 | 2.2 | D.L. | D.L. | D.L. |
| Ex. 12 | Choline | 6.0 | NTMP | 1.0 | 9.9 | 0.9 | 0.7 | D.L. | D.L. | D.L. |
| Ex. 13 | TEA | 1.2 | EDTPO | 0.1 | 9.0 | 1.2 | 1.6 | D.L. | 6.3 | D.L. |
| Ex. 14 | TEA | 8.1 | EDTPO | 0.1 | 8.0 | D.L. | 2.0 | D.L. | 17.6 | D.L. |
| Ex. 15 | TEA | 15.6 | EDTPO | 0.2 | 9.0 | D.L. | 2.2 | 0.1 | 13.8 | D.L. |
| Ex. 16 | TEA | 36.9 | EDTPO | 0.5 | 9.0 | D.L. | 1.0 | 0.2 | 0.3 | D.L. |
| Ex. 17 | TEA | 1.1 | Glyphosine | 0.1 | 8.0 | D.L. | 1.8 | D.L. | D.L. | D.L. |
| Ex. 18 | TEA | 7.3 | Glyphosine | 0.1 | 9.0 | 0.5 | 1.3 | D.L. | 0.2 | D.L. |
| Ex. 19 | TEA | 13.5 | Glyphosine | 0.2 | 9.0 | 0.5 | 1.5 | D.L. | D.L. | D.L. |
| Ex. 20 | TEA | 33.2 | Glyphosine | 0.5 | 9.0 | 0.2 | 2.1 | D.L. | D.L. | D.L. |
| Ex. 21 | TEA | 1.1 | NTMP | 0.1 | 8.0 | 0.3 | 1.7 | D.L. | 2.6 | D.L. |
| Ex. 22 | TEA | 7.3 | NTMP | 0.1 | 8.0 | D.L. | 1.7 | D.L. | 1.2 | D.L. |
| Ex. 23 | TEA | 13.5 | NTMP | 0.2 | 9.0 | D.L. | 1.6 | D.L. | D.L. | D.L. |
| Ex. 24 | TEA | 33.2 | NTMP | 0.5 | 9.0 | D.L. | 0.5 | D.L. | D.L. | D.L. |
| Ex. 25 | TMAH | 1.5 | EDTPO | 10.0 | 10.0 | D.L. | 3.3 | D.L. | 0.2 | 0.2 |
| Ex. 26 | TMAH | 2.2 | Glyphosine | 10.0 | 10.0 | 0.4 | 1.0 | 0.1 | 0.7 | D.L. |
| Ex. 27 | TMAH | 1.7 | NTMP | 10.0 | 10.0 | 3.1 | 0.4 | 0.1 | D.L | D.L. |
| Comp. Ex. 1 | Choline | 1.0 | — | | 10.0 | 24.9 | 59.2 | 38.7 | 46.5 | 33.5 |
| Comp. Ex. 2 | TEA | 10.0 | — | | 9.9 | 22.9 | 9.4 | 86.2 | 48.2 | 45.4 |
| Comp. Ex. 3 | TMAH | 1.0 | — | | 9.9 | 24.9 | 133.0 | 20.0 | 126.0 | 12.5 |
| Comp. Ex. 4 | TMAH | 1.2 | NTA | 1.0 | 10.0 | 0.2 | 58.8 | 2.0 | 6.7 | 11.7 |
| Comp. Ex. 5 | TMAH | 1.3 | EDTA | 1.0 | 10.0 | 0.6 | 49.0 | 1.3 | 2.9 | 11.0 |
| Comp. Ex. 6 | TMAH | 1.3 | DPTA | 1.0 | 10.0 | 0.5 | 28.4 | 0.8 | 0.7 | 11.7 |
| Comp. Ex. 7 | TMAH | 1.0 | Ascorbic acid | 1.0 | 8.0 | D.L. | 79.7 | 2.4 | 93.9 | 75.0 |
| Comp. Ex. 8 | TMAH | 2.0 | Oxalic acid | 11.0 | 9.9 | D.L. | 104.0 | D.L. | 15.4 | 71.5 |
| Comp. Ex. 9 | TMAH | 1.4 | Lactic acid | 1.0 | 10.0 | 1.2 | 88.9 | 11.0 | 24.3 | 68.2 |

EDTPO: N,N,N',N'-ethylenediaminetetrakis(methylenephosphonic acid)
NTMP: nitrilotris(methylenephosphonic acid)
TEA: triethanolamine
TMAH: tetramethylammonium hydroxide
NTA: nitrilotriacetic acid
EDTA: ethylenediaminetetraacetic acid
DPTA: diethylenetriaminepentaacetic acid
D.L: Below detection limit (less than $10^9$ atoms/cm$^2$)

As shown in Table 1, an aqueous solution of a basic compound to which no chelating agent was added had low removability. Furthermore, when a carboxylic acid-based chelating agent such as NTA, EDTA, or DPTA, an aliphatic carboxylic acid such as oxalic acid or lactic acid, or ascorbic acid, which is a reducing agent, was added, although the removability was improved for some metals, removability for all of the five types of metals could not be improved. On the other hand, when the phosphonic acid-based chelating agent was added, there was an effect on all of the five types of metals, and the degree of cleanness required for post-CMP cleaning could be achieved.

<Evaluation 2: Particulate Removability>

An 8 inch silicon wafer on the surface of which a film of Cu had been formed by an electroplating method was polished using a CMP device and a CMP slurry (silica slurry (ø35 nm)) for 30 seconds. Subsequently, it was subjected in a cleaning device to brush scrubber cleaning at room temperature using each cleaning liquid for 30 seconds, a rinsing treatment using ultrapure water for 30 seconds, and spin drying. The cleaned wafer was subjected to counting of the number of particulates on the surface using a surface profiler, and the particulate removability was thus evaluated. Table 2 shows the compositions of the cleaning liquids and the results.

TABLE 2

Results of evaluation of particulate removability by cleaning liquids

| | Basic compound | | Added component | | Added component | | | No. of particulates after cleaning (No./8 inch wafer, ø0.3 μm↑) |
|---|---|---|---|---|---|---|---|---|
| | Type | Concn. (mmol/L) | Type | Concn. (mmol/L) | Type | Concn. (ppm) | pH | |
| Ex. 28 | Choline | 3.0 | EDTPO | 0.5 | — | | 9.3 | 69 |
| Ex. 29 | Choline | 6.0 | EDTPO | 1.0 | — | | 10.0 | 429 |

TABLE 2-continued

Results of evaluation of particulate removability by cleaning liquids

| | Basic compound | | Added component | | Added component | | pH | No. of particulates after cleaning (No./8 inch wafer, ø0.3 µm↑)) |
|---|---|---|---|---|---|---|---|---|
| | Type | Concn. (mmol/L) | Type | Concn. (mmol/L) | Type | Concn. (ppm) | | |
| Ex. 30 | Choline | 2.2 | Glyphosine | 0.5 | — | | 9.6 | 116 |
| Ex. 31 | Choline | 4.3 | Glyphosine | 1.0 | — | | 10.0 | 301 |
| Ex. 32 | Choline | 2.8 | NTMP | 0.5 | — | | 9.9 | 116 |
| Ex. 33 | Choline | 5.6 | NTMP | 1.0 | — | | 10.0 | 415 |
| Ex. 34 | TEA | 1.2 | EDTPO | 0.1 | — | | 8.1 | 121 |
| Ex. 35 | TEA | 25.0 | EDTPO | 1.0 | — | | 8.5 | 764 |
| Ex. 36 | TEA | 1.1 | Glyphosine | 0.1 | — | | 8.1 | 115 |
| Ex. 37 | TEA | 7.3 | Glyphosine | 0.1 | — | | 9.0 | 737 |
| Ex. 38 | TEA | 1.5 | NTMP | 0.1 | — | | 8.0 | 134 |
| Ex. 39 | TEA | 5.0 | NTMP | 0.1 | — | | 8.8 | 614 |
| Ex. 40 | TEA | 1.3 | NTMP | 0.1 | NIKKOL CMT-30 | 33 | 8.2 | 65 |
| Ex. 41 | TEA | 5.0 | NTMP | 0.1 | NIKKOL Sarcosinate LN | 33 | 8.2 | 56 |
| Ex. 42 | TEA | 5.0 | NTMP | 0.1 | DKS-NL dash408 | 33 | 8.0 | 181 |
| Comp. Ex. 10 | Choline | 3.0 | — | | — | | 11.4 | 5082 |
| Comp. Ex. 11 | TEA | 1.2 | — | | — | | 9.2 | 2586 |
| Comp. Ex. 12 | TEA | 8.1 | — | | — | | 9.6 | 3478 |
| Comp. Ex. 13 | TMAH | 0.1 | — | | — | | 9.7 | 42758 |
| Comp. Ex. 14 | TMAH | 1.1 | — | | — | | 10.9 | 2241 |
| Comp. Ex. 15 | Piperazine | 0.6 | — | | — | | 9.5 | 5164 |
| Comp. Ex. 16 | MMP | 0.8 | — | | — | | 9.7 | 20072 |
| Comp. Ex. 17 | TMAH | 21.0 | Ascorbic acid | 5.5 | — | | 11.9 | 6174 |
| Comp. Ex. 18 | MMP | 0.8 | CyDTA | 0.1 | — | | 9.0 | 5655 |
| Comp. Ex. 19 | TMAH | 4.2 | Oxalic acid | 2.0 | — | | 10.2 | 3849 |
| Comp. Ex. 20 | Choline | 0.4 | Oxalic acid | 2.0 | — | | 8.9 | 1267 |
| Comp. Ex. 21 | TEA | 14.7 | Oxalic acid | 2.0 | — | | 9.4 | 2134 |
| Comp. Ex. 22 | TEA | 1.2 | EDTA | 0.1 | — | | 8.9 | 1881 |
| Comp. Ex. 23 | TEA | 5.7 | CyDTA | 0.1 | — | | 9.0 | 8804 |
| Comp. Ex. 24 | TEA | 15.0 | CyDTA | 1.0 | — | | 8.4 | 5079 |

EDTPO: N,N,N',N'-ethylenediaminetetrakis(methylenephosphonic acid)
NTMP: nitrilotris(methylenephosphonic acid)
TEA: triethanolamine
TMAH: tetramethylammonium hydroxide
MMP: 1-(2-dimethylaminoethyl)-4-methylpiperazine
CyDTA: trans-1,2-cyclohexanediaminetetraacetic acid
EDTA•2NH$_3$: ethylenediaminetetraacetic acid diammonium
NIKKOL CMT-30: coconut oil fatty acid methyltaurine, anionic surfactant
NIKKOL Sarcosinate LN: lauroylsarcosine, anionic surfactant
DKS-NL dash408: nonionic surfactant As shown in Table 2, an aqueous solution of a basic compound to which no chelating agent was added had low removability, and a large number of particulates remained on the Cu surface. Even when a carboxylic acid-based chelating agent such as EDTA or CyDTA, an aliphatic carboxylic acid such as oxalic acid, or ascorbic acid, which is a reducing agent, was added, the particulate removability did not improve. On the other hand, when the phosphonic acid-based chelating agent was added, the particulate removability was dramatically improved.

<Evaluation 3: Damage to Cu (Etching Rate)>

An 8 inch silicon wafer on the surface of which a film of Cu had been formed by a sputtering method was sectioned into 1.0×1.5 cm$^2$ and immersed in a polyethylene container containing 48 mL of each cleaning liquid at 30° C. for 7 minutes without stirring, the Cu concentration of the cleaning liquid from which the wafer had been taken out was then measured by means of an ICP-MS (inductively coupled plasma mass spectrometer), and the Cu etching rate (E.R.) of the cleaning liquid was calculated from the surface area of Cu on the wafer and the Cu concentration of the cleaning liquid. With regard to each cleaning liquid, the pH of the aqueous solution of the chelating agent prepared at a predetermined concentration was measured using a pH meter, and was adjusted to a predetermined pH by adding a basic compound. Table 3 shows the compositions of the cleaning liquids and the results.

TABLE 3

Results of evaluation of Cu damage (E.R.) by cleaning liquids

| | Added component | | Basic compound Type | pH after adjustment | Cu E.R. (Å/min.) |
|---|---|---|---|---|---|
| | Type | Concn. (mmol/L) | | | |
| Ex. 43 | EDTPO | 1.0 | Choline | 9.0 | 1.5 |
| Ex. 44 | EDTPO | 1.0 | Choline | 10.0 | 1.4 |
| Ex. 45 | Glyphosine | 1.0 | Choline | 8.1 | 1.5 |
| Ex. 46 | Glyphosine | 1.0 | Choline | 9.0 | 1.3 |

TABLE 3-continued

Results of evaluation of Cu damage (E.R.) by cleaning liquids

|  | Added component | | Basic | pH after | |
|  | Type | Concn. (mmol/L) | compound Type | adjust-ment | Cu E.R. (Å/min.) |
| --- | --- | --- | --- | --- | --- |
| Ex. 47 | Glyphosine | 1.0 | Choline | 10.0 | 1.0 |
| Ex. 48 | NTMP | 1.0 | Choline | 8.0 | 1.7 |
| Ex. 49 | NTMP | 1.0 | Choline | 9.0 | 1.3 |
| Ex. 50 | NTMP | 1.0 | Choline | 10.0 | 0.9 |
| Ex. 51 | EDTPO | 0.1 | TEA | 8.0 | 1.1 |
| Ex. 52 | EDTPO | 0.1 | TEA | 9.0 | 1.0 |
| Ex. 53 | EDTPO | 0.2 | TEA | 9.0 | 1.6 |
| Ex. 54 | Glyphosine | 0.1 | TEA | 8.0 | 1.0 |
| Ex. 55 | Glyphosine | 0.1 | TEA | 9.0 | 1.0 |
| Ex. 56 | Glyphosine | 0.2 | TEA | 9.0 | 1.8 |
| Ex. 57 | NTMP | 0.1 | TEA | 8.0 | 0.9 |
| Ex. 58 | NTMP | 0.1 | TEA | 9.0 | 0.9 |
| Ex. 59 | NTMP | 0.2 | TEA | 9.0 | 1.5 |
| Ex. 60 | EDTPO | 0.5 | TMAH | 10.0 | 1.0 |
| Ex. 61 | EDTPO | 1.0 | TMAH | 10.0 | 1.2 |
| Ex. 62 | Glyphosine | 0.5 | TMAH | 10.0 | 1.0 |
| Ex. 63 | Glyphosine | 1.0 | TMAH | 10.0 | 1.2 |
| Ex. 64 | NTMP | 0.5 | TMAH | 10.0 | 0.8 |
| Ex. 65 | NTMP | 1.0 | TMAH | 10.0 | 0.9 |
| Comp. Ex. 25 | Glyphosine | 1.0 | TMAH | 7.0 | 3.4 |
| Comp. Ex. 26 | NTMP | 1.0 | TMAH | 7.0 | 5.0 |
| Comp. Ex. 27 | CyDTA | 1.0 | Choline | 7.3 | 2.5 |
| Comp. Ex. 28 | CyDTA | 1.0 | MMP | 7.0 | 8.2 |
| Comp. Ex. 29 | CyDTA | 1.0 | MMP | 8.1 | 5.4 |

EDTPO: N,N,N',N'-ethylenediaminetetrakis(methylenephosphonic acid)
NTMP: nitrilotris(methylenephosphonic acid)
TEA: triethanolamine
TMAH: tetramethylammonium hydroxide
MMP: 1-(2-dimethylaminoethyl)-4-methylpiperazine
CyDTA: trans-1,2-cyclohexanediaminetetraacetic acid As shown in Table 3, it was found that when the pH was less than 8, the E.R. of Cu was high; when the pH was 8 to 10, the E.R. of Cu was low, and even with a cleaning liquid containing a chelating agent and having high metallic impurity removability the damage to a metal material on the substrate surface was small.

<Evaluation 4: Damage to Cu (Surface Roughness)>

An 8 inch silicon wafer on the surface of which a film of Cu had been formed by an electroplating method was immersed in an aqueous solution of oxalic acid (1 wt %) at 25° C. for 1 minute without stirring, rinsed using ultrapure water, dried, then immersed in a cleaning liquid at 25° C. for 30 minutes without stirring, then rinsed using ultrapure water, dried, and then subjected to measurement of Cu surface roughness (average surface roughness: Ra) using an AFM (atomic force microscope). Table 4 shows the compositions of the cleaning liquids and the results.

TABLE 4

Results of evaluation of Cu damage (surface roughness) by cleaning liquids

|  | Added component | | Basic | | Cu surface average surface |
|  | Type | Concn. (mmol/L) | compound Type | pH | roughness (Ra) (nm) |
| --- | --- | --- | --- | --- | --- |
|  | Before treatment | | | — | 0.88 |
| Ex. 66 | EDTPO | 0.5 | Choline | 9.0 | 1.29 |
| Ex. 67 | Glyphosine | 0.5 | Choline | 9.0 | 1.00 |

TABLE 4-continued

Results of evaluation of Cu damage (surface roughness) by cleaning liquids

|  | Added component | | Basic | | Cu surface average surface |
|  | Type | Concn. (mmol/L) | compound Type | pH | roughness (Ra) (nm) |
| --- | --- | --- | --- | --- | --- |
| Ex. 68 | NTMP | 0.5 | Choline | 9.0 | 1.24 |
| Comp. Ex. 30 | Oxalic acid (1.2 mmol/L) | | | 2.0 | 3.51 |

EDTPO: N,N,N',N'-ethylenediaminetetrakis(methylenephosphonic acid)
NTMP: nitrilotris(methylenephosphonic acid)
TEA: triethanolamine As shown in Table 4, in the same way as for the results in Table 3, an aqueous solution of a basic compound to which a phosphonic acid-based chelating agent was added did not greatly increase the Cu surface roughness even when immersion was carried out for a long time, and showed very low damage to Cu compared with an aqueous solution of oxalic acid, which is generally used as a post-CMP cleaning liquid.

<Evaluation 5: Damage to Low-k Material>

A silicon wafer on which a film of a coating type SiOC-based low permittivity (low-k) material (permittivity: 2.2) had been formed was immersed in each cleaning liquid at 25° C. for 3 and 30 minutes without stirring, rinsed using ultrapure water, dried, and then subjected to measurement of an infrared absorption (IR) spectrum using an FT-IR (Fourier transform IR absorption spectrometer), and the Si—O bond absorption at around 1150 cm$^{-1}$ was compared.

Figure 3:
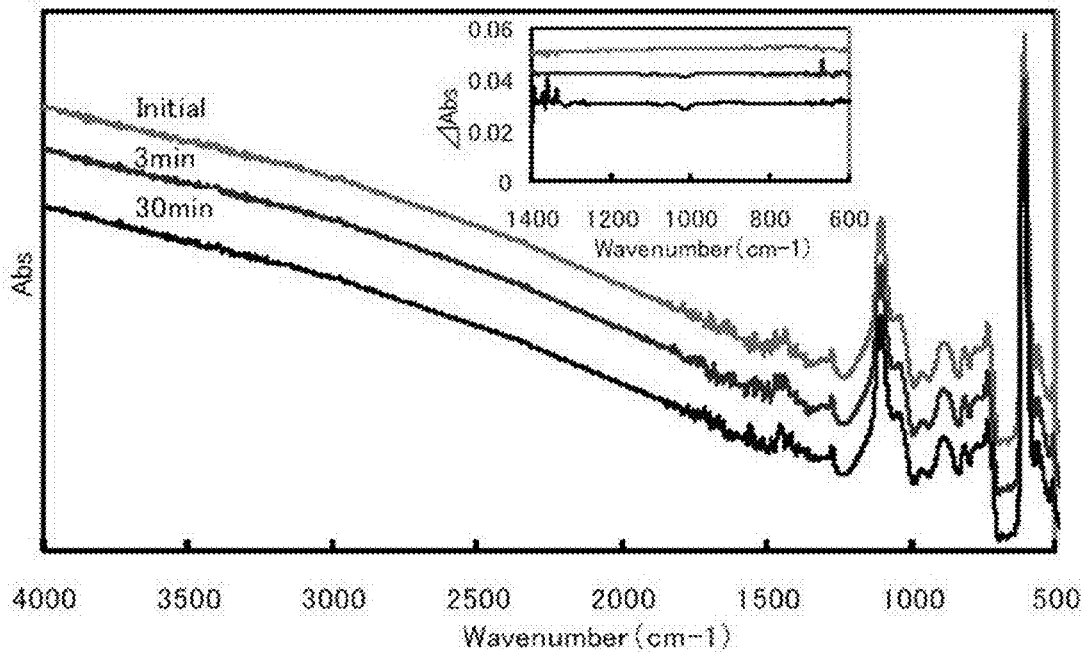
FIG. 3 is a diagram showing an infrared absorption (IR) spectrum of a silicon wafer with a film formed from a coating type SiOC-based low permittivity (low-k) material after treatment in Example 69.
Figure 4:
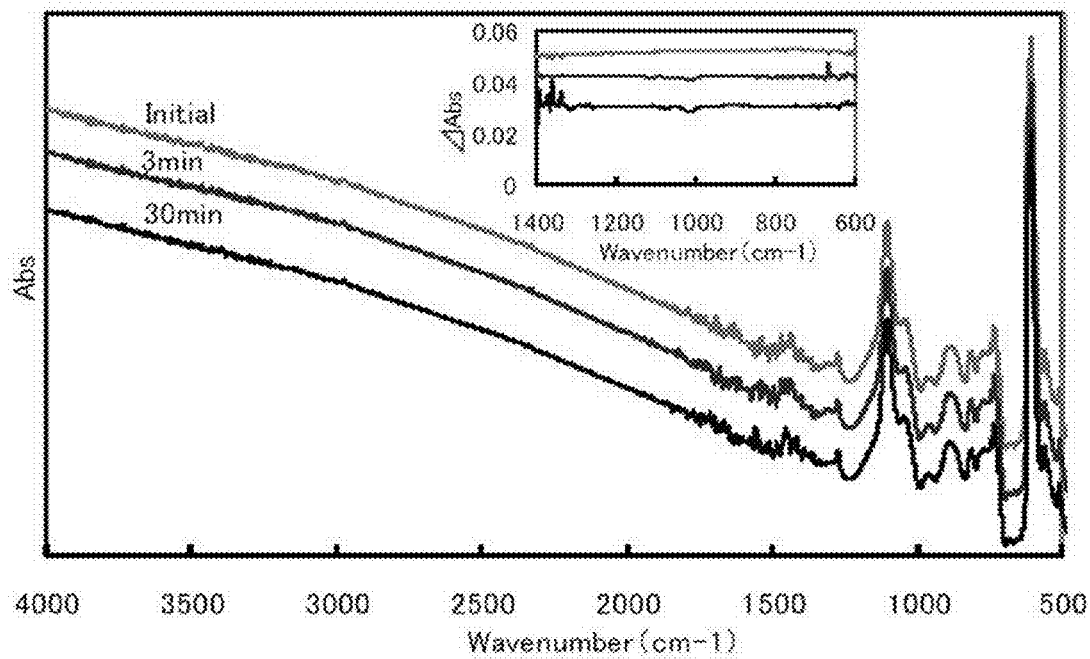
FIG. 4 is a diagram showing an infrared absorption (IR) spectrum of a silicon wafer with a film formed from a coating type SiOC-based low permittivity (low-k) material after treatment in Example 70.
Figure 5:
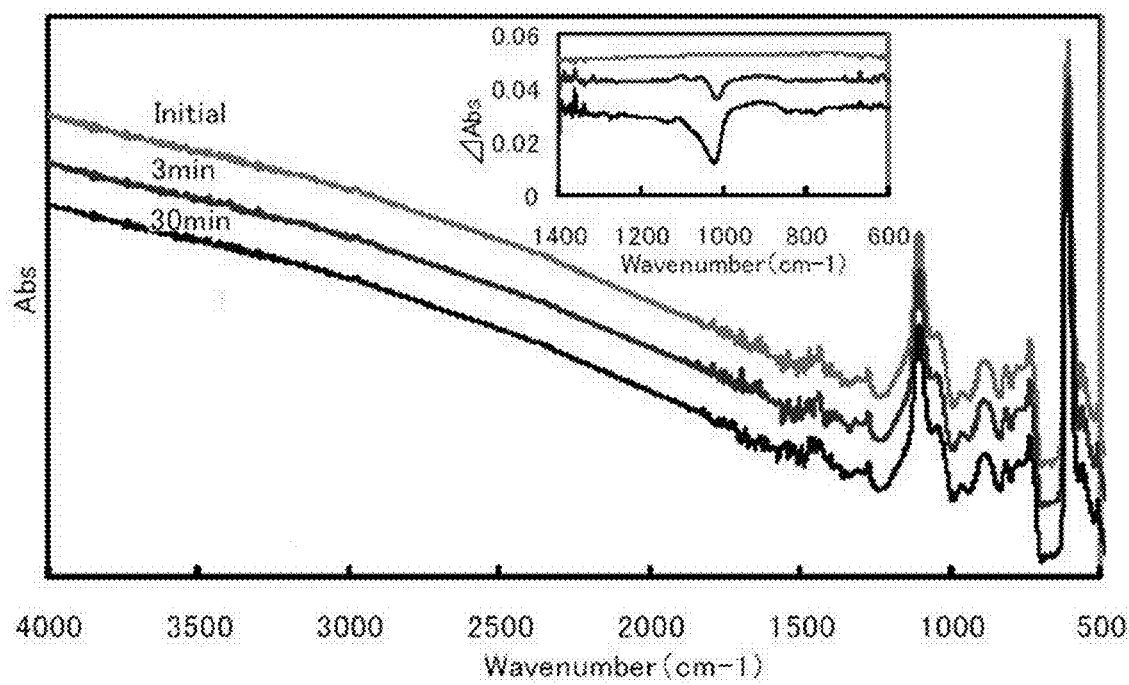
FIG. 5 is a diagram showing an infrared absorption (IR) spectrum of a silicon wafer with a film formed from a coating type SiOC-based low permittivity (low-k) material after treatment in Comparative Example 31.

Table 5 shows the compositions of the cleaning liquids and the evaluation results, and FIGS. 3 to 5 show IR spectra.

TABLE 5

Results of evaluation of low-k material damage (IR spectrum change) by cleaning liquids

|  | Added component | | Basic | | Change in |
|  | Type | Concn. (mmol/L) | compound Type | pH | spectrum around 1150 cm$^{-1}$ |
| --- | --- | --- | --- | --- | --- |
| Ex. 69 | NTMP | 0.5 | Choline | 9.0 | No |
| Ex. 70 | NTMP | 0.5 | TEA | 9.0 | No |
| Comp. Ex. 31 | | | TMAH | 11.0 | Yes |

NTMP: nitrilotris(methylenephosphonic acid)
TEA: triethanolamine
TMAH: tetramethylammonium hydroxide As shown in Table 5 and FIGS. 3 to 5, the aqueous solution of TMAH, which has a pH of 11, showed a large change in the Si—O bond-derived absorption of the low-k material between that before and that after the treatment, suggesting that the structure of the low-k material had changed, but the aqueous solutions having a pH in the range of 8 to 10 did not show such a change, the damage to the low-k material being small.

The invention claimed is:
1. A cleaning liquid composition for cleaning a semiconductor substrate having copper wiring, the cleaning liquid composition consisting of:
one or more basic compound containing no metal;
one or more phosphonic acid-based chelating agent selected from the group consisting of glycine-N,N-bis

(methylenephosphonic acid) (glyphosine), nitrilotris (methylenephosphonic acid) (NTMP) and a salt thereof; and water, wherein the cleaning liquid composition has a hydrogen ion concentration (pH) of 8 to 9.9.

2. The cleaning liquid composition according to claim 1, wherein the semiconductor substrate is a substrate after chemical mechanical polishing (CMP).

3. The cleaning liquid composition according to claim 1, wherein the basic compound is a quaternary ammonium compound or a straight-chain aliphatic amine.

4. The cleaning liquid composition according to claim 1, wherein the basic compound is
 a quaternary ammonium compound other than tetramethylammonium hydroxide, or an alkanolamine.

5. A concentrate for dilution by 10 times to 1000 times to give the cleaning liquid composition according to claim 1.

6. The concentrate according to claim 5, wherein the concentrate is diluted with a diluent comprising water.

7. The concentrate according to claim 5, wherein the concentrate has a pH of 10 to 12.

8. A method for cleaning a semiconductor substrate having copper wiring by use of the cleaning liquid composition according to claim 1, the method comprising:
 applying the cleaning liquid composition onto the semiconductor substrate.

9. A cleaning liquid composition for cleaning a semiconductor substrate having copper wiring, the cleaning liquid composition consisting of:

one or more basic compound containing no metal;

one or more phosphonic acid-based chelating agent selected from the group consisting of glycine-N,N-bis (methylenephosphonic acid) (glyphosine), nitrilotris (methylenephosphonic acid) (NTMP) and a salt thereof;

one or more types of anionic or nonionic surfactant; and water, wherein the cleaning liquid composition has a hydrogen ion concentration (pH) of 8 to 9.9.

10. The cleaning liquid composition according to claim 9, wherein the semiconductor substrate is a substrate after chemical mechanical polishing (CMP).

11. The cleaning liquid composition according to claim 9, wherein the basic compound is a quaternary ammonium compound or a straight-chain aliphatic amine.

12. The cleaning liquid composition according to claim 9, wherein the basic compound is a quaternary ammonium compound other than tetramethylammonium hydroxide, or an alkanolamine.

13. A concentrate for dilution by 10 times to 1000 times to give the cleaning liquid composition according to claim 9.

14. The concentrate according to claim 13, wherein the concentrate is diluted with a diluent comprising water.

15. The concentrate according to claim 13, wherein the concentrate has a pH of 10 to 12.

16. A method for cleaning a semiconductor substrate having copper wiring by use of the cleaning liquid composition according to claim 9, the method comprising:
 applying the cleaning liquid composition onto the semiconductor substrate.

* * * * *